United States Patent
Li et al.

(10) Patent No.: US 11,637,257 B2
(45) Date of Patent: Apr. 25, 2023

(54) ELECTROLUMINESCENT MATERIAL INK AND ELECTROLUMINESCENT DEVICE THEREOF

(71) Applicant: GUANGDONG JUHUA PRINTED DISPLAY TECHNOLOGY CO., LTD., Guangzhou (CN)

(72) Inventors: Zhe Li, Guangzhou (CN); Xiangwei Xie, Guangzhou (CN); Jingyao Song, Guangzhou (CN); Dong Fu, Guangzhou (CN)

(73) Assignee: GUANGDONG JUHUA PRINTED DISPLAY TECHNOLOGY CO. LTD, Guangzhou (CN)

( * ) Notice: Subject to any disclaimer, the term of this patent is extended or adjusted under 35 U.S.C. 154(b) by 434 days.

(21) Appl. No.: 16/768,243

(22) PCT Filed: Jan. 25, 2018

(86) PCT No.: PCT/CN2018/074172
§ 371 (c)(1),
(2) Date: May 29, 2020

(87) PCT Pub. No.: WO2019/119613
PCT Pub. Date: Jun. 27, 2019

(65) Prior Publication Data
US 2020/0373508 A1    Nov. 26, 2020

(30) Foreign Application Priority Data
Dec. 18, 2017    (CN) .......................... 201711366659.9

(51) Int. Cl.
*H01L 51/00*    (2006.01)
*H01L 51/50*    (2006.01)
(Continued)

(52) U.S. Cl.
CPC .............. *H01L 51/502* (2013.01); *C08K 5/03* (2013.01); *C09D 11/36* (2013.01); *C09D 11/38* (2013.01);
(Continued)

(58) Field of Classification Search
None
See application file for complete search history.

(56) References Cited

U.S. PATENT DOCUMENTS

2005/0109989 A1* 5/2005 Whiteford ........... H01L 51/0068
252/500
2007/0034833 A1* 2/2007 Parce .................... C01B 19/007
252/301.36

(Continued)

FOREIGN PATENT DOCUMENTS

CN    101810056 A    8/2010
CN    105062193 A    11/2015
(Continued)

OTHER PUBLICATIONS

Peng, Xiaogang, et al. "Epitaxial growth of highly luminescent CdSe/CdS core/shell nanocrystals with photostability and electronic accessibility." Journal of the American Chemical Society 119.30 (1997): 7019-7029. (Year: 1997).*
(Continued)

*Primary Examiner* — Robert S Loewe
(74) *Attorney, Agent, or Firm* — Dorsey & Whitney LLP

(57) ABSTRACT

The present disclosure relates to an electroluminescent material ink, comprising a quantum dot material, an organic light emitting material, and an organic solvent. The organic solvent includes a first solvent shown in general formula (I):

(Continued)

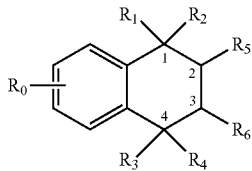

(I)

wherein R0 is $C_mH_{2m+1}$; R1, R2, R3, and R4 are each independently $C_nH_{2n+1}$, $0 \leq m \leq 8$ and $0 < n \leq 8$, or $0 < m \leq 8$ and $0 \leq n \leq 8$. The electroluminescent material ink has good physical parameters and can effectively prevent nozzle blockage.

14 Claims, 1 Drawing Sheet

(51) Int. Cl.
| | |
|---|---|
| C08K 5/03 | (2006.01) |
| C09D 11/36 | (2014.01) |
| C09D 11/38 | (2014.01) |
| C09K 11/02 | (2006.01) |
| C09K 11/06 | (2006.01) |
| C09K 11/56 | (2006.01) |
| C09K 11/88 | (2006.01) |
| B82Y 20/00 | (2011.01) |

(52) U.S. Cl.
CPC ............ *C09K 11/025* (2013.01); *C09K 11/06* (2013.01); *C09K 11/565* (2013.01); *C09K 11/883* (2013.01); *H01L 51/0005* (2013.01); *H01L 51/0007* (2013.01); *B82Y 20/00* (2013.01)

(56) References Cited

U.S. PATENT DOCUMENTS

| | | | | |
|---|---|---|---|---|
| 2009/0135120 | A1* | 5/2009 | Shibatani | C09D 11/326 524/517 |
| 2009/0314991 | A1 | 12/2009 | Cho et al. | |
| 2010/0264371 | A1 | 10/2010 | Nick | |
| 2013/0215203 | A1* | 8/2013 | Chen | B41J 29/377 347/102 |
| 2015/0118773 | A1* | 4/2015 | Kojima | H01L 33/502 252/301.36 |
| 2017/0084844 | A1* | 3/2017 | Parham | C07D 413/10 |
| 2018/0230321 | A1* | 8/2018 | Pan | C09D 11/30 |
| 2020/0127203 | A1* | 4/2020 | Béalle | C09D 11/36 |
| 2020/0136046 | A1* | 4/2020 | Béalle | H01L 51/56 |
| 2021/0355337 | A1* | 11/2021 | Guo | C09D 11/50 |

FOREIGN PATENT DOCUMENTS

| | | |
|---|---|---|
| CN | 105131712 A | 12/2015 |
| CN | 105907180 A | 8/2016 |
| CN | 106103648 A | 11/2016 |
| CN | 106519799 A | 3/2017 |
| CN | 105219163 B | 2/2020 |
| EP | 3560917 A1 | 10/2019 |
| WO | 0240600 A1 | 5/2002 |
| WO | 2017028639 A1 | 2/2017 |

OTHER PUBLICATIONS

International Search Report and Written Opinion from International Application No. PCT/CN2018/074172 dated Sep. 25, 2018.

"Studies of Electroluminescence Films and Preparing the Light Emitting Diode Devices Based on Inkjet Printing Technology", South China University of Technology, a Dissertation Submitted for the Degree of Doctor of Materials Science, Jun. 2016, 126 pages.

Dabin, et al., "A Study on Synthesis of Trimethyl-Tetrahydronaphthalene", Journal of Sichuan Teachers College (Natural Science), vol. 20, No. 1, Mar. 1999, pp. 40-43.

Schnee, et al., "Contact Printing of a Quantum Dot and Polymer Cross-Reactive Array Sensor", http://dx.doi.org/10.1016/j.snb.2016.06.036, 2016, pp. 506-511.

Zong, et al., "Molecular Simulation of the Impact of Alkyl Substituent on Hydrogen Donating Ability of Alkyl Tetralin", Oct. 2012, pp. 705-710.

* cited by examiner

ELECTROLUMINESCENT MATERIAL INK AND ELECTROLUMINESCENT DEVICE THEREOF

TECHNICAL FIELD

The present disclosure relates to the technical field of photoelectric devices, particularly to electroluminescent material ink and related electroluminescent devices.

BACKGROUND

Ink-jet printing technology has been widely studied and used in the manufacture of optoelectronic devices in recent years. Particularly for the manufacture of panel display devices such as OLED and QLED, inkjet printing is considered as an effective way of addressing the high-cost issue and realizing large-area panels. This technology can be combined with solution-based functional materials and advanced inkjet printing devices to make OLED or QLED displays, which can improve the utilization rate of materials and the production efficiency, reduce manufacturing costs and increase productivity. However, inkjet printing devices have high requirements on ink, in terms of, for example, proper boiling point, viscosity, surface tension, and uniform and stable solutes, which cause great difficulties in ink formulation.

Conventionally, in order to control and adjust the physical parameters of the ink and prevent the ink from clogging the nozzles of the printing devices, some additives such as alcohol polymers are added into the ink. However, the polymer additives with insulating properties are not easy to be removed, and introduction of such polymers tends to reduce the charge transport capability of a film and have a negative impact on the photoelectric performance, thereby limiting the application of the photoelectric devices. Therefore, it is necessary to improve the ink to have good physical parameters without addition of additives, by which the ink is able to directly form liquid columns flowing out from the inkjet port instead of ink droplets, thereby preventing the ink from clogging the nozzles.

SUMMARY

Considering above, an electroluminescent material ink and a related electroluminescent device are provided to solve the problem of nozzle clogging.

An electroluminescent material ink includes a quantum dot material, an organic light emitting material and an organic solvent. The organic solvent includes a first solvent having a general formula (I):

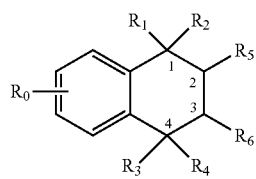

R0 represents $C_mH_{2m+1}$;
R1, R2, R3, R4, R5 and R6 respectively represent $C_nH_{2n+1}$;
wherein $0 \leq m \leq 8$ and $0 < n \leq 8$, or $0 < m \leq 8$ and $0 \leq n \leq 8$.

The electroluminescent material ink has a suitable boiling point, viscosity, surface tension, and uniform and stable quantum dots and organic light emitting materials, which can better match the requirements of inkjet printing devices and printing process conditions. Films produced by inkjet printing are uniform, and nozzle clogging is effectively prevented. In addition, the ink solvent can be removed by vacuum evaporation or heating evaporation, etc., so that the solvents in the printed electroluminescent layer can be completely volatilized to guarantee the performance of the formed films of light emitting layer.

Specifically, the alkyl substituted tetrahydronaphthalene has good compatibility with quantum dot and organic light emitting materials, making both the quantum dot material and the organic light emitting material have good solubility in the same solvent system, and avoiding nozzle clogging otherwise caused by precipitation of the materials. On the one hand, the alkyl substituents of the molecules of alkyl substituted tetrahydronaphthalene have good compatibility with the quantum dot material around which long-chain alkanes are wrapped, and the alkyl at positions 1, 2, 3, or 4 has strong steric hindrance, thereby effectively preventing the agglomeration of molecules of the quantum dot material and the organic material. On the other hand, the benzene ring units of the molecules of alkyl substituted tetrahydronaphthalene also provide good solubility for the organic material with conjugated structures. Therefore, the alkyl substituted tetrahydronaphthalene is an ideal solvent for the light emitting layer ink formed by mixing the quantum dot material and the organic light emitting material.

In addition, in the mixed ink of the quantum dot material and the organic material, the main function of quantum dot material is to emit light, so that the advantages of narrow emission spectrum and high color purity of the quantum dot material can be fully utilized.

The main function of the organic light emitting material is to recombine electrons and holes in whole or in part on the molecules of the organic light emitting material to generate excitons, and then transfer the energy of the excitons to quantum dots. Generally, quantum dot materials have a deeper highest occupied molecular orbital (HOMO), and there is a large potential barrier for the injection of holes from the hole transport layer into the quantum dot light emitting layer. By contrast, the organic light emitting materials have a shallower HOMO, which is more conducive to the injection of holes from the hole transport layer to the light emitting layer. Therefore, a higher luminous performance and a longer service life of the electroluminescent material ink can be realized, and the performance of the electroluminescent material ink can be effectively guaranteed.

In an embodiment, in the general formula (I), $0 \leq m \leq 4$ and $0 < n \leq 4$, or $0 < m \leq 4$ and $0 \leq n \leq 4$.

In an embodiment, the electroluminescent material ink has a viscosity of 2 cP-15 cP and a surface tension of 25 mN/m-40 mN/m.

Formation of ink droplets is prevented since the ink has the above fluid characteristics and liquid columns of ink are formed that flow out from an inkjet port, and nozzle clogging is thereby avoided.

In an embodiment, the first solvent includes one or more of 1-methyl-1,2,3,4-tetrahydronaphthalene, 2-methyl-1,2,3,4-tetrahydronaphthalene, 5-methyl-1,2,3,4-tetrahydronaphthalene, 6-methyl-1,2,3,4-tetrahydronaphthalene, 1,5-dimethyl-1,2,3,4-tetrahydronaphthalene, 1,2,3,4-tetrahydro-6,7-dimethylnaphthalene, 1,2,3,4-tetrahydro-1,1-dimethylnaphthalene, 1,2,3,4-tetrahydro-1,4-dimethylnaphthalene, 1,2,3,4-tetrahydro-1,8-dimethylnaphthalene, 1,2,3,4-tetrahydro-2,7- dimethylnaphthalene, 5,8-dimethyl-1,2,3,4-tetrahydronaphthalene, 1,1,4,4-tetramethyl-1,2,3,4-tetrahydronaphthalene, 6-ethyl-1,2,3,4-tetrahydro-1,1,4,4-tetramethylnaphthalene, 1,2,3,4-tetrahydro-1-propylnaphthalene, 5-ethyl-1,2,3,4-tetrahydronaphthalene, 1,1,4,4,6-pentamethyl-1,2,3,4-tetrahydronaphthalene.

In an embodiment, the organic solvent further includes a second solvent that is a halogenated aromatic hydrocarbon solvent.

The second solvent is mixed with the first solvent to form a mixed solvent, which enables a better dispersion performance and a better solubility of the quantum dot materials and the organic light emitting materials in the organic solvent, and further prevents nozzle clogging.

In an embodiment, the quantum dot material includes a group II-IV compound semiconductor, a group III-V compound semiconductor, a group IV-VI compound semiconductor or a I-III-VII group semiconductor nanocrystals.

The organic light emitting material includes a phosphorescent material, a delayed fluorescent material, a rare earth complex material or an exciplex composite material.

The average size of the quantum dot material is from 2 nm to 20 nm, and the quantum dot material is of a uniform mixing type, a gradient mixing type, a core-shell type, or a joint type.

In an embodiment, a long-chain ligand is wrapped around the quantum dot material. The long-chain ligand is selected from one or more of organic carboxylic acid ligands, organic thiol ligands, organic amine ligands, and organic phosphine (oxide) ligands, phospholipids, soft phospholipids, or polyvinylpyridine. The electroluminescent material ink described above is used in display or lighting devices.

The electroluminescent material ink has a suitable boiling point, viscosity, surface tension, and uniform and stable quantum dots and organic light emitting materials, which can better match the requirements of inkjet printing devices and printing process conditions. Films produced by inkjet printing are uniform, and nozzle clogging is effectively prevented. In addition, the ink solvent can be removed by vacuum evaporation or heating evaporation, etc., so that the solvents in the printed electroluminescent layer can be completely volatilized to guarantee the performance of the formed films of light emitting layer, making the electroluminescent material ink suitable for use in display or lighting devices.

An electroluminescent device includes a light emitting layer made from the above electroluminescent material ink.

Since the above electroluminescent material ink has good dispersibility and the solvent in the ink can be completely volatilized during the formation of the electroluminescent layer, the ink is capable of forming a film of light emitting layer. Therefore, the electroluminescent device containing the ink emits light more uniformly and has a longer service life.

A display or lighting device includes the above electroluminescent device.

Since the above electroluminescent device emits light more uniformly and has a longer service life, the display or lighting devices using the electroluminescent device obtains a better display or lighting effect and has a longer service life.

DETAILED DESCRIPTION

Figure 1:
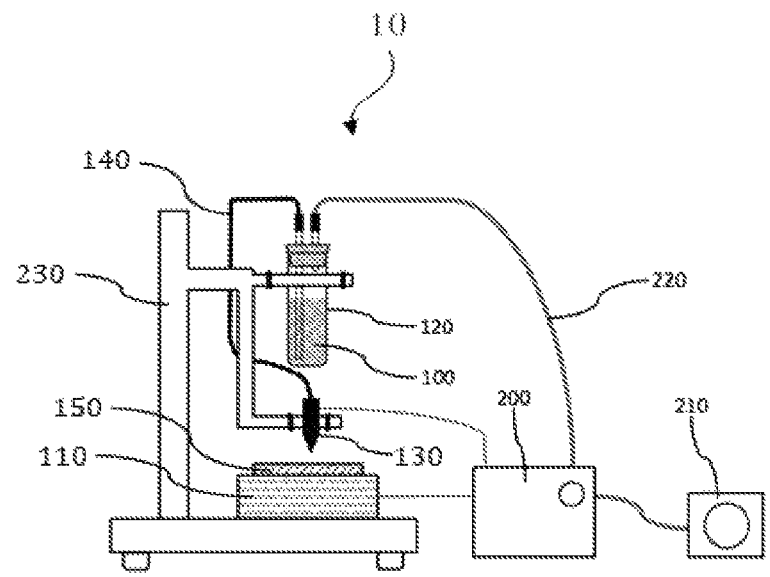
FIG. 1 is a schematic view of a spray printing device according to an embodiment.

In order to obtain electroluminescent material ink with good physical parameters which allow the ink to directly form liquid columns flowing out from the inkjet port instead of ink droplets, and prevent the ink from clogging the nozzles, an electroluminescent material ink is provided, which includes a quantum dot material, an organic light emitting material and an organic solvent. The organic solvent includes a first solvent having a general formula (I):

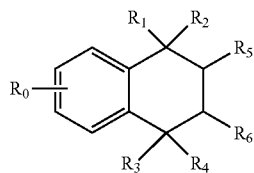

$R_0$ represents $C_mH_{2m+1}$;
$R_1, R_2, R_3, R_4, R_5$ and $R_6$ respectively represent $C_nH_{2n+1}$;
Wherein $0 \leq m \leq 8$ and $0 < n \leq 8$, or $0 < m \leq 8$ and $0 \leq n \leq 8$;

That is, m and n cannot be zero at the same time (that is, excluding tetrahydronaphthalene). Compared with tetrahydronaphthalene, alkyl substituted tetrahydronaphthalene has a higher boiling point and a lower saturated vapor pressure, and it has better compatibility with quantum dots and organic materials, thereby effectively avoiding the precipitation of the materials and nozzle clogging.

The alkyl substituted tetrahydronaphthalene solvent (first solvent) has a saturated vapor pressure of less than 0.08 kPa at room temperature (25° C.). The alkyl substituted tetrahydronaphthalene solvent can be evaporated and removed from the solvent system by vacuum drying or heating drying.

In an embodiment, the first solvent includes one or more of: 1-methyl-1,2,3,4-tetrahydronaphthalene, 2-methyl-1,2,3,4-tetrahydronaphthalene, 5-methyl-1,2,3,4-tetrahydronaphthalene, 6-methyl-1,2,3,4-tetrahydronaphthalene, 1,5-dimethyl-1,2,3,4-tetrahydronaphthalene, 1,2,3,4-tetrahydro-6,7-dimethylnaphthalene, 1,2,3,4-tetrahydro-1,1-dimethylnaphthalene, 1,2,3,4-tetrahydro-1,4-dimethylnaphthalene, 1,2,3,4-tetrahydro-1,8-dimethylnaphthalene, 1,2,3,4-tetrahydro-2,7-dimethylnaphthalene, 5,8-dimethyl-1,2,3,4-tetrahydronaphthalene, 1,1,4,4-tetramethyl-1,2,3,4-tetrahydronaphthalene, 6-ethyl-1,2,3,4-tetrahydro-1,1,4,4-tetramethylnaphthalene, 1,2,3,4-tetrahydro-1-propylnaphthalene, 5-ethyl-1,2,3,4-tetrahydronaphthalene, 1,1,4,4,6-pentamethyl-1,2,3,4-tetrahydronaphthalene.

In addition, in order to further improve the physical performance parameters of the ink, the above organic solvent may further include a second solvent. The second solvent may be a halogenated aromatic hydrocarbon solvent which may be: chlorobenzene, bromobenzene, iodobenzene, 1,2-dichlorobenzene, 1,3-trichlorobenzene, 1,2-dibromobenzene, 1,3-dibromobenzene, o-chlorotoluene, o-bromotoluene, p-bromotoluene. In an embodiment, the second solvent is chlorobenzene.

In order to avoid clogging during the spraying, the electroluminescent ink to be used needs to have a suitable viscosity and surface tension. In an embodiment, the viscosity of the ink is from 2 cP to 15 cP, and the surface tension is from 25 mN/m to 40 mN/m.

In addition, quantum dot, also known as nanocrystal, is a quasi-zero-dimensional nanomaterial, which is composed of a limited number of atoms. The three dimensions of the quantum dot are on the order of nanometers, and the appearance looks like a tiny dot. The internal electron motion is restricted in a three-dimensional space, and the quantum confinement effect is particularly significant. Quantum dots will be combined to emit light when they are excited by long segmental wavelength light or an electric field. The emitted light of quantum dots has excellent characteristics such as high color purity, high quantum efficiency, adjustable color, and long service life. These characteristics make quantum dot electroluminescence (also called "quantum dot light emitting diode", QLED) using quantum dot materials as the light emitting layer have wide application prospects in the fields of solid-state lighting and panel display etc., and has attracted the attention from academia and the industry. Quantum dot materials have a good light emitting stability, in that nanocrystalline semiconductor materials are very stable to the energy of (singlet state) excitons. Therefore, electrons and holes combine to generate excitons on the energy donor materials that are based on organic light emitting materials, and then the energy of the excitons on the organic energy donor materials is transferred to quantum dots that act as energy acceptors, consequently obtaining efficient and stable QLED devices.

In addition, the quantum dot may be a group II-IV compound semiconductor, a group III-V compound semiconductor, a group IV-VI compound semiconductor, or a group I-III-VII semiconductor nanocrystal.

Among them, the group II-IV compound semiconductor may be CdS, CdSe, CdS/ZnS, CdSe/ZnS or CdSe/CdS/ZnS. The group III-V may be GaAs or InP, and the group IV-VI compound semiconductor may be PbS/ZnS or PbSe/ZnS.

In an embodiment, the average size of the quantum dot material is from 2 nm-20 nm, and it may be of a uniform mixing type, a gradient mixing type, a core-shell type, or a joint type.

In an embodiment, the quantum dot material is an oil-soluble quantum dot;

In an embodiment, the quantum dot material is selected from doped or undoped quantum dot.

Wherein, the ligands of the quantum dot include one or more of organic carboxylic acid ligand, organic thiol ligand, organic amine ligand, organic phosphine ligand, organic phosphine oxide ligand, phospholipid, soft phospholipid, and polyvinylpyridine, etc.

The organic acid ligands include one or more of decanoic acid, undecylenic acid, myristic acid, oleic acid and stearic acid;

The organic thiol ligands include one or more of octaalkyl mercaptan, dodecyl mercaptan and octadecyl mercaptan;

The organic amine ligands include one or more of oleylamine, octadecylamine and octaamine;

The organic phosphine ligands include trioctylphosphine;

The organic ophosphine oxide ligands include trioctylphosphine oxide.

In addition, the organic materials of energy donors that are suitable for acting with quantum dots need to meet: (1) the band gap of the organic materials needs to be greater than the quantum dot, or the peak wavelength of the emission spectrum of the organic material needs to be less than the peak wavelength of the emission spectrum of the quantum dot material; (2) the excited state decay lifetime of the organic material measured at room temperature in a nitrogen environment must be longer than the excited state decay lifetime of the quantum dot light emitting material. Organic materials that can meet the above conditions can usually find suitable energy donors from the following types of organic materials: phosphorescent materials, delayed fluorescent materials, rare earth complex materials or exciplex composite materials.

In an embodiment, the phosphorescent materials include an iridium complex, a platinum complex, a ruthenium complex, or a gold complex.

In an embodiment, the delayed fluorescent materials include a pure organic compound that contains both electron-donating groups and electron-withdrawing groups in a molecular and has an excited state decay lifetime greater than 500 nanoseconds measured at room temperature in a nitrogen environment, a copper complex or a silver complex.

In an embodiment, the exciplex composite material includes a mixture of two organic materials having electron-donating groups and electron-withdrawing groups respectively.

A suitable organic material of an energy donor is introduced into the light emitting layer of a quantum dot electroluminescent device, for example, quantum dots are mixed with the organic material of the energy donor, so that the shallow highest occupied molecular orbital (HOMO) of the organic material can be used to narrow the potential barrier of injection of holes from the hole transport layer into the quantum dot light emitting layer, so as to effectively reduce the driving voltage of the device and improve the stability of the device.

Both quantum dot materials and organic materials can be dissolved in organic solvents, and electroluminescent devices can be made by using solution processing methods. Solution processing methods include spin coating, knife coating, slit coating, screen printing, letterpress or gravure printing, and inkjet printing.

In order to ensure that the quantum dot material and the organic light emitting material have good solubility in the organic solvent, and avoid nozzle clogging otherwise caused by precipitation of the materials, the weight percentage of the quantum dot material and organic light emitting material in the electroluminescent material ink is 0.1%-20%, and the weight percentage of the organic solvent in the electroluminescent material ink is 80.0%-99.9% in this embodiment.

In addition, the present disclosure also provides a device for inkjet printing the above electroluminescent material ink. As shown in FIG. 1, the inkjet printing device 10 includes a stage 110, a closed container 120, a printing nozzle 130, an infusion tube 140, a printing controller 160, a positive pressure generator 170, and a pipe 180. The basic working mechanism of the inkjet printing of the inkjet printing device is that the ink is ejected from tiny nozzles and landed at designated positions on an object under the control of the controller, and a pre-designed pattern is consequently formed.

Specifically, the stage 110 is used to carry the substrate 150 to be inkjet printed. The closed container 120 is used to carry the electroluminescent material ink 100. The printing nozzle 130 is used to inkjet print the electroluminescent material ink 100 onto the substrate 150. The infusion tube 140 communicates with the closed container 120 and the printing nozzle 130 for transferring the electroluminescent material ink 100 from the closed container 120 to the printing nozzle 130. The printing controller 200 is connected to the stage 110, and communicates with the closed container 120 via the pipe 180 for controlling inkjet printing. The positive pressure generator 170 communicates with the printing controller 160 and provides pressure to the closed container 120 under the control of the printing controller 160 so that the electroluminescent material ink 100 is delivered through the infusion tube 140 and inkjet printed onto the substrate 150 by the printing nozzle 130.

It should be noted that the connection between the printing controller 160 and the stage 110 may be an electrical connection or a magnetic connection. The printing controller 160 can control the movement of the stage 110 so as to control the shape of the ink on the substrate 150. It is also possible to control the movement of the printing nozzle 130 to further control the shape of the ink on the substrate 150. In addition, the print controller 160 can also control the pressure in the closed container 120 by controlling the air flow of the positive pressure generator 170, thereby controlling the amount of ink injected from the printing nozzle 130 and further the thickness of a film formed on the substrate 150.

In an embodiment, the inkjet printing device further includes a bracket 190 for fixing the entire device.

In addition, the above electroluminescent material ink can also be printed or coated on the substrate by other devices which are not limited to the above-mentioned inkjet printing device.

An electroluminescent device includes a light emitting layer made from the electroluminescent material ink. It can be made by spin coating, knife coating, slit coating, screen printing, letterpress or gravure printing, and inkjet printing. In an embodiment, the light emitting layer is made by an inkjet printing device as shown in FIG. 1.

Figure 2:
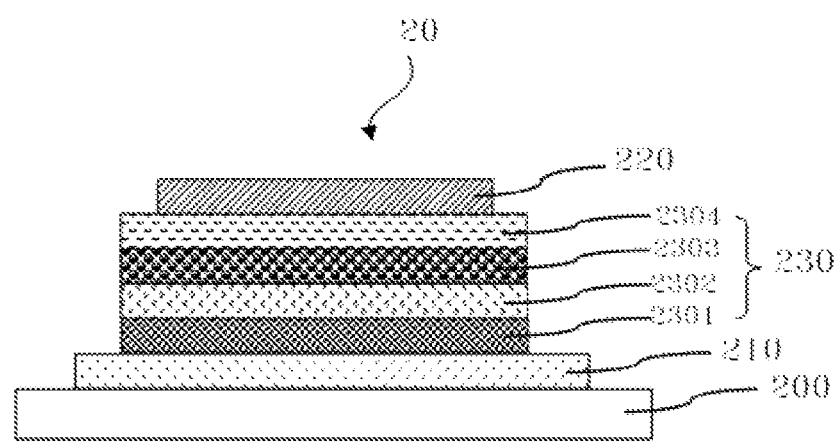
FIG. 2 is a schematic view of an electroluminescent device according to an embodiment.

In an embodiment, as shown in FIG. 2, the electroluminescent device 20 includes a substrate 200, a first electrode 210, a second electrode 220 and a functional layer 230. The functional layer 230 is located between the first electrode 210 and the second electrode 220 and in contact with the first electrode 210 and the second electrode 220. The functional layer 230 includes a hole injection layer 2301, a hole transport layer 2302, a light emitting layer 2303, and an electron transport layer 2304. Among them, the light emitting layer 2303 is made of the above-mentioned electroluminescent material ink by inkjet printing.

It should be noted that the structure of the above device is only exemplary, and some functional layers may be properly added or removed as needed. For example, an electron blocking layer, a hole blocking layer, an electron injection layer, an exciton blocking layer, etc. The specific structure of the electroluminescent device does not limit the application of the light emitting layer ink of the present disclosure in the manufacture of the electroluminescent device.

The present disclosure also includes a display or lighting device including an electroluminescent device as described above.

The present disclosure will be described below with reference to specific embodiments.

It should be noted that the reagents or instruments whose specific sources are not specified in the present disclosure are conventional reagents or instruments that are commercially available.

EMBODIMENT I

Sample Preparation

Example 1 to example 5, and comparative example 1 and comparative example 2 are prepared as follows.

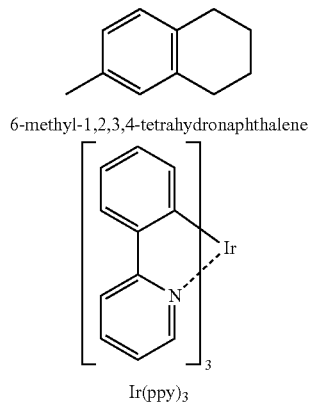

6-methyl-1,2,3,4-tetrahydronaphthalene

Ir(ppy)$_3$

The light emitting layer ink in this example is composed of 6-methyl-1,2,3,4-tetrahydronaphthalene, red CdSe/ZnS quantum dots (the peak wavelength of the emitting light is 625 nm), and green phosphorescent material Ir(ppy)$_3$. The 6-methyl-1,2,3,4-tetrahydronaphthalene solvent accounts for 97% of the total weight of the ink. The red CdSe/ZnS quantum dot material accounts for 2% of the total weight of the ink, and the green phosphorescent material Ir(ppy)$_3$ accounts for 1% of the total weight of the ink.

The following components are added to a one-neck flask of approximate 500 ml respectively in the order: 2 wt % red CdSe/ZnS quantum dots, 1 wt % green phosphorescent material Ir(ppy)$_3$, 97 wt % 6-methyl-1,2,3,4-tetrahydronaphthalene. The mixture is then stirred for 60 minutes, and after filtration, an ink composition 1 (Example 1) will be obtained.

Example 2

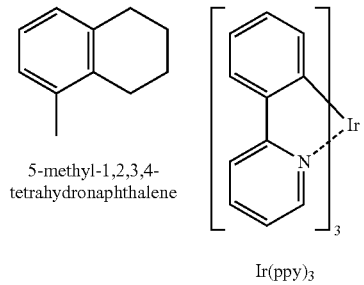

5-methyl-1,2,3,4-tetrahydronaphthalene

Ir(ppy)$_3$

The light emitting layer ink in this example is composed of 5-methyl-1,2,3,4-tetrahydronaphthalene, red CdSe/ZnS quantum dots (the peak wavelength of the emitting light is 625 nm), and green phosphorescent material Ir(ppy)$_3$. The 5-methyl-1,2,3,4-tetrahydronaphthalene solvent accounts for 97% of the total weight of the ink. The red CdSe/ZnS quantum dot material accounts for 2% of the total weight of the ink, and the green phosphorescent material Ir(ppy)$_3$ accounts for 1% of the total weight of the ink.

The following components are added to a one-neck flask of approximate 500 ml respectively in the order: 2 wt % red CdSe/ZnS quantum dots, 1 wt % green phosphorescent material Ir(ppy)$_3$, 97 wt % 5-methyl-1,2,3,4-tetrahydronaphthalene. The mixture is then stirred for 60 minutes, and after filtration, an ink composition 2 (Example 2) will be obtained.

Example 3

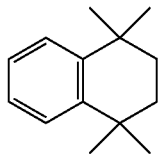

1,1,4,4-tetramethyl-1,2,3,4-tetrahydronapthalene

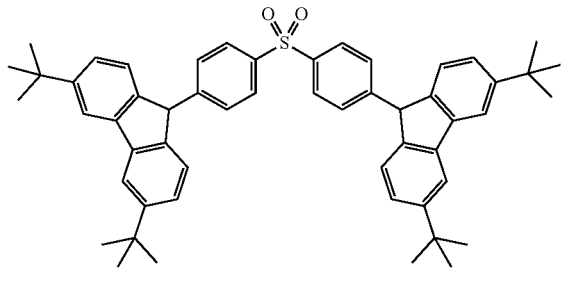

CZ-PS

The light emitting layer ink in this example is composed of 1,1,4,4-tetramethyl-1,2,3,4-tetrahydronaphthalene, red CdSe/ZnS quantum dots (the peak wavelength of the emitting light is 625 nm), and blue delayed fluorescent material CZ-PS. The 1,1,4,4-tetramethyl-1,2,3,4-tetrahydronaphthalene solvent accounts for 97% of the total weight of the ink, the red CdSe/ZnS quantum dot material accounts for 2% of the total weight of the ink, and the blue delayed fluorescent material CZ-PS accounts for 1% of the total weight of the ink.

The following components are added to a one-neck flask of approximate 500 ml respectively in the order: 2 wt % red CdSe/ZnS quantum dots, 1 wt % blue delayed fluorescent material CZ-PS, and 97 wt % 1,1,4,4-tetramethyl-1,2,3,4-tetrahydronaphthalene. The mixture is then stirred for 60 minutes, and after filtration, an ink composition 3 (Example 3) will be obtained.

Example 4

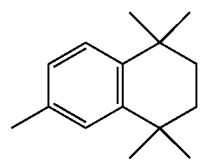

1,1,4,4,6-pentamethyl-1,2,3,4-tetrahydronaphthalene

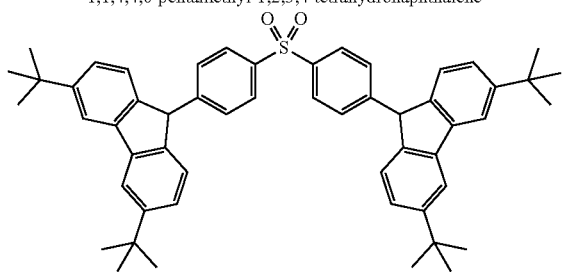

CZ-PS

The light emitting layer ink in this example is composed of 1,1,4,4,6-pentamethyl-1,2,3,4-tetrahydronaphthalene, red CdSe/ZnS quantum dots (the peak wavelength of the emitting light is 625 nm), and blue delayed fluorescent material CZ-PS. The 1,1,4,4,6-pentamethyl-1,2,3,4-tetrahydronaphthalene solvent accounts for 97% of the total weight of the ink, red CdSe/ZnS quantum dot material accounts for 2% of the total weight of the ink, and the blue delayed fluorescent material CZ-PS accounts for 1% of the total weight of the ink.

The following components are added to a one-neck flask of approximate 500 ml respectively in the order: 2 wt % red CdSe/ZnS quantum dots, 1 wt % blue delayed fluorescent material CZ-PS, and 97 wt % 1,1,4,4,6-pentamethyl-1,2,3,4-tetrahydronaphthalene. The mixture is then stirred for 60 minutes, and after filtration, an ink composition 4 (Example 4) will be obtained.

Example 5

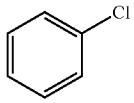

chlorobenzene

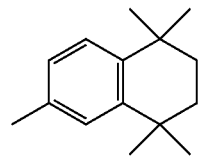

1,1,4,4,6-pentamethyl-1,2,3,4-tetrahydronaphthalene

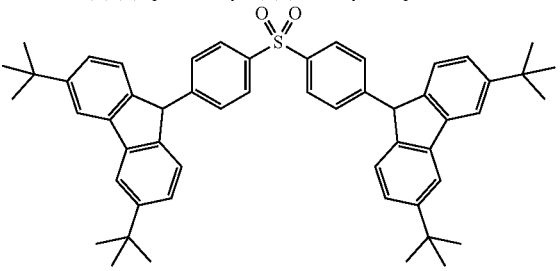

CZ-PS

The light emitting layer ink in this example includes two solvents, composed of chlorobenzene, 1,1,4,4,6-pentamethyl-1,2,3,4-tetrahydronaphthalene, red CdSe/ZnS quantum dots (the peak wavelength of the emitting light is 625 nm), and blue delayed fluorescent material CZ-PS. The chlorobenzene solvent accounts for 20% of the total weight of the ink, the 1,1,4,4,6-pentamethyl-1,2,3,4-tetrahydronaphthalene solvent accounts for 77% of the total weight of the ink, the red CdSe/ZnS quantum dot material accounts for 2% of the total weight of the ink, and the blue delayed fluorescent material CZ-PS accounts for 1% of the total weight of the ink.

The following components are added to a one-neck flask of approximate 500 ml respectively in the order: 2 wt % red CdSe/ZnS quantum dots, 1 wt % blue delayed fluorescent material CZ-PS, 20 wt % chlorobenzene, and 77 wt % 1,1,4,4,6-pentamethyl-1,2,3,4-tetrahydronaphthalene. The mixture is then stirred for 60 minutes, and after filtration, an ink composition 5 (Example 5) will be obtained.

Comparative Example 1

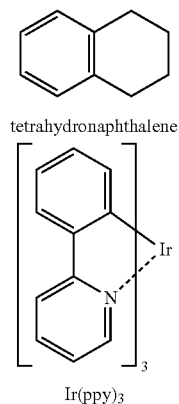

tetrahydronaphthalene

Ir(ppy)₃

The light emitting layer ink in this example is composed of tetrahydronaphthalene, red CdSe/ZnS quantum dots (the peak wavelength of the emitting light is 625 nm), and green phosphorescent material Ir(ppy)$_3$. The tetrahydronaphthalene solvent accounts for 97% of the total weight of the ink, the red CdSe/ZnS quantum dot material accounts for 2% of the total weight of the ink, and the green phosphorescent material Ir(ppy)$_3$ accounts for 1% of the total weight of the ink.

The following components are added to a one-neck flask of approximate 500 ml respectively in the order: 2 wt % red CdSe/ZnS quantum dots, 1 wt % green phosphorescent material Ir(ppy)$_3$, and 97 wt % tetrahydronaphthalene. The mixture is then stirred for 60 minutes, and after filtration, an ink composition 6 (Comparative example 1) will be obtained.

Comparative Example 2

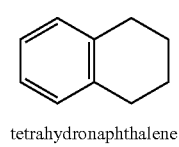

tetrahydronaphthalene

Ir(ppy)₃ chlorobenzene

The light emitting layer ink in this example is composed of tetrahydronaphthalene, chlorobenzene, red CdSe/ZnS quantum dots (the peak wavelength of the emitting light is 625 nm), and green phosphorescent material Ir(ppy)$_3$. The tetrahydronaphthalene solvent accounts for 97% of the total weight of the ink, the red CdSe/ZnS quantum dot material accounts for 2% of the total weight of the ink, and the green phosphorescent material Ir(ppy)3 accounts for 1% of the total weight of the ink.

The following components are added to a one-neck flask of approximate 500 ml respectively in the order: 2 wt % red CdSe/ZnS quantum dots, 1 wt % green phosphorescent material Ir(ppy)$_3$, 20 wt % chlorobenzene, and 77 wt % tetrahydronaphthalene. The mixture is then stirred for 60 minutes, and after filtration, an ink composition 6 (Comparative example 2) will be obtained.

EMBODIMENT II

Performance Test

The ink according to examples 1 to 5 and comparative examples 1 and 2 are used for inkjet printing to determine the number of clogged nozzles. In this embodiment, a sprayer has a total number of 128 nozzles, and the experimental results are shown in Table 1 below.

TABLE 1

| | Example 1 | Example 2 | Example 3 | Example 4 | Example 5 | Comparative example 1 | Comparative example 2 |
|---|---|---|---|---|---|---|---|
| Main Solvent | 6-methyltetrahydro-naphthalene | 5-methyltetrahydro-naphthalene | 1,1,4,4-tetramethyl-1,2,3,4-tetrahydro-naph-thalene | 1,1,4,4,6-pentamethyl-1,2,3,4-tetrahydro-naph-thalene | 1,1,4,4,6-pentamethyl-1,2,3,4-tetrahydro-naph-thalene chlorobenzene | tetrahydro-naph-thalene | tetrahydro-naph-thalene chlorobenzene |
| Number of Clogged Nozzles | 18 | 19 | 13 | 10 | 8 | 35 | 30 |

It can be seen from Table 1 that when alkyl tetrahydronaphthalene is used as the main solvent, the number of clogged nozzle is less than that using tetrahydronaphthalene as the main solvent.

In addition, comparing Example 3 and Example 4, it can be seen that the addition of chlorobenzene to the alkyl tetrahydronaphthalene can reduce the probability of nozzle clogging. In addition, comparing Example 1 to Example 4 and comparative Example 2, it can be seen that the number of clogged nozzles resulted by the mixture of the tetrahydronaphthalene and chlorobenzene is still larger than that of Example 1 to Example 4. That is, the performance of alkyl substituted tetrahydronaphthalene in preventing nozzle clogging is better than the mixture of tetrahydronaphthalene and chlorobenzene.

The technical features of the above-mentioned embodiments can be combined arbitrarily. To simplify the description, all possible combinations of the technical features in the above-mentioned embodiments are not described. However, as long as there is no contradiction in the combination of these technical features, all should be considered within the scope of this description.

The above-mentioned embodiments only express a few examples of the present disclosure, and their descriptions are specific and detailed, but should not be considered as limiting the protection scope of the invention. It should be noted that, for a person of ordinary skill in the art, without departing from the concept of the present disclosure, several modifications and improvements can also be made, which all fall within the protection scope of the present disclosure. Therefore, the protection scope of the invention shall be subject to the appended claims.

The invention claimed is:

1. An electroluminescent material ink, comprising:
a quantum dot material;
an organic light emitting material; and
an organic solvent including a first solvent having a general formula (I):

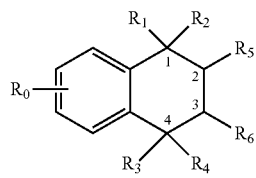

$R_0$ represents $C_mH_{2m+1}$;
$R_1$, $R_2$, $R_3$, $R_4$, $R_5$ and $R_6$ respectively represent $C_nH_{2n+1}$;
wherein, $0 \leq m \leq 8$ and $0 < n \leq 8$, or $0 < m \leq 8$ and $0 \leq n \leq 8$; and
wherein the organic solvent further comprises a second solvent that is a halogenated aromatic hydrocarbon solvent.

2. The electroluminescent material ink according to claim 1, wherein $0 \leq m \leq 4$ and $0 < n \leq 4$, or $0 < m \leq 4$ and $0 \leq n \leq 4$.

3. The electroluminescent material ink according to claim 1, wherein the weight percentage of the organic solvent in the electroluminescent material ink is 80.0%-99.9%.

4. The electroluminescent material ink according to claim 1, wherein the electroluminescent material ink has a viscosity of 2 cP-5 cP and a surface tension of 25 mN/m-40 mN/m.

5. The electroluminescent ink according to claim 1, wherein the first solvent comprises one or more of 5-methyl-1,2,3,4-tetrahydronaphthalene, 6-methyl-1,2,3,4-tetrahydronaphthalene, 6-ethyl-1,2,3,4-tetrahydro-1,1,4,4-tetramethylnaphthalene, or 5-ethyl-1,2,3,4-tetrahydronaphthalene.

6. The electroluminescent material ink according to claim 1, wherein the first solvent is 6-methyl-1,2,3,4-tetrahydronaphthalene, or 5-methyl-1,2,3,4-tetrahydronaphthalene.

7. The electroluminescent material ink according to claim 1, wherein the second solvent is chlorobenzene.

8. The electroluminescent material ink according to claim 1, wherein the quantum dot material comprises at least one of a group II-IV compound semiconductor, a group III-V compound semiconductor, a group IV-VI compound semiconductor or a group I-III-VII semiconductor nanocrystals, and the organic light emitting material comprises a phosphorescent material, a delayed fluorescent material, a rare earth complex material, or an exciplex composite material.

9. The electroluminescent material ink according to claim 8, wherein the average size of the quantum dot material is from 2 nm to 20 nm, and the quantum dot material is of a uniform mixing type, a gradient mixing type, a core-shell type, or a joint type.

10. The electroluminescent material ink according to claim 8, wherein the quantum dot material includes an oil-soluble quantum dot material.

11. The electroluminescent material ink according to claim 8, wherein the ligands of the quantum dot material comprise one or more of organic carboxylic acid ligand, organic thiol ligand, organic amine ligand, organic phosphine ligand, organic phosphine oxide ligand, phospholipid, soft phospholipid, or polyvinylpyridine.

12. The electroluminescent material ink according to claim 11, wherein the organic acid ligand comprises one or more of decanoic acid, undecylenic acid, myristic acid, oleic acid, or stearic acid,
wherein the organic thiol ligand comprises one or more of octaalkyl mercaptan, dodecyl mercaptan, or octadecyl mercaptan,
wherein the organic amine ligand comprises one or more of oleylamine, octadecylamine, or octaamine,
wherein the organic phosphine ligand comprises trioctylphosphine, and
wherein the organic ophosphine oxide ligand comprises trioctylphosphine oxide.

13. An electroluminescent device comprising a light emitting layer made from an electroluminescent material ink,
wherein the electroluminescent material ink comprises a quantum dot material, an organic light emitting material and an organic solvent, the organic solvent comprising a first solvent having a general formula (I):

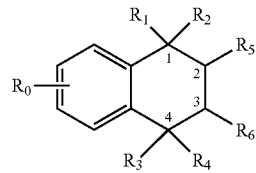

wherein $R_0$ represents $C_mH_{2m+1}$;
$R_1$, $R_2$, $R_3$, $R_4$, $R_5$ and $R_6$ respectively represent $C_nH_{2n+1}$; and
$0 \leq m \leq 8$ and $0 < n \leq 8$, or $0 < m \leq 8$ and $0 \leq n \leq 8$;
wherein the organic solvent further comprises a second solvent that is a halogenated aromatic hydrocarbon solvent.

14. A display or lighting device comprising an electroluminescent device, the electroluminescent device comprising a light emitting layer made from electroluminescent material ink,
wherein the electroluminescent material ink comprises a quantum dot material, an organic light emitting material, and an organic solvent, the organic solvent comprising a first solvent having a general formula (I):

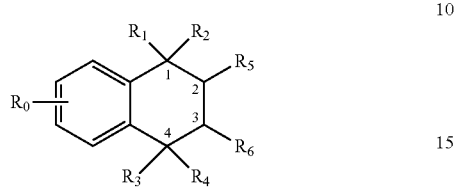

wherein $R_0$ represents $C_mH_{2m+1}$;
$R_1$, $R_2$, $R_3$, $R_4$, $R_5$ and $R_6$ respectively represent $C_nH_{2n+1}$; and
$0 \leq m \leq 8$ and $0 < n \leq 8$, or $0 < m \leq 8$ and $0 \leq n \leq 8$;
wherein the organic solvent further comprises a second solvent that is a halogenated aromatic hydrocarbon solvent.

* * * * *